United States Patent
Schottler et al.

(10) Patent No.: US 6,765,412 B1
(45) Date of Patent: Jul. 20, 2004

(54) MULTI-RANGE CURRENT SAMPLING HALF-BRIDGE OUTPUT DRIVER

(75) Inventors: Joseph J. Schottler, Crystal, MN (US); Dennis A. Burns, White Bear Township, MN (US)

(73) Assignee: Sauer-Danfoss Inc., Minneapolis, MN (US)

( * ) Notice: Subject to any disclaimer, the term of this patent is extended or adjusted under 35 U.S.C. 154(b) by 0 days.

(21) Appl. No.: 10/427,220

(22) Filed: May 1, 2003

(51) Int. Cl.[7] .......................................... H03K 19/0175
(52) U.S. Cl. ........................ 326/83; 326/30; 318/599; 318/811; 323/282
(58) Field of Search ............................. 323/282, 284, 323/285, 297, 315, 316; 326/30, 83, 85, 86, 87, 91; 318/599

(56) References Cited

U.S. PATENT DOCUMENTS

| | | |
|---|---|---|
| 3,991,359 A | 11/1976 | Thompson et al. |
| 5,258,653 A | 11/1993 | Perry |
| 5,266,838 A | 11/1993 | Gerner |
| 5,309,078 A * | 5/1994 | Cameron .................... 318/811 |
| 5,442,515 A | 8/1995 | Wallaert |
| 5,546,268 A | 8/1996 | Hurley et al. |
| 5,689,162 A * | 11/1997 | Li ............................... 318/599 |
| 5,748,431 A | 5/1998 | Goodnight et al. |
| 5,796,278 A | 8/1998 | Osborn et al. |
| 5,867,014 A | 2/1999 | Wrathall et al. |
| 5,874,818 A * | 2/1999 | Schuurman ................. 318/439 |
| 6,249,418 B1 | 6/2001 | Bergstrom |
| 6,304,066 B1 * | 10/2001 | Wilcox et al. .............. 323/282 |
| 6,465,999 B2 | 10/2002 | D'Angelo |

FOREIGN PATENT DOCUMENTS

| | | |
|---|---|---|
| JP | 358128488 A | 8/1983 |

* cited by examiner

*Primary Examiner*—Michael Tokar
*Assistant Examiner*—Khai Nguyen

(57) ABSTRACT

A current sampling half-bridge output driver capable of driving a wide range of loads using an accurate selection of current sensing resistors. Pluralities of stages are connected in series with the current sensing resistors from each stage connected in series. A range selector selects the stage appropriate for each current load. The reference resistors for a selected stage includes the current sensing resistor associated with that stage added in series to all current sensing resistors electrically connected between the selected stage and the load. The disclosed circuit avoids switching resistors in and out of the circuit and thereby increases the accuracy of the sensing resistor circuit.

8 Claims, 1 Drawing Sheet

MULTI-RANGE CURRENT SAMPLING HALF-BRIDGE OUTPUT DRIVER

BACKGROUND OF THE INVENTION

The present invention relates to a current sampling output driver that is capable of sensing and adjusting to accommodate a wide range of current loads. More specifically, the invention is a half-bridge output driver designed to interface an inductive or capacitive load, typically a motor, to a low voltage logic device in order to detect and control of the speed, power, and torque of a motor.

DC motor performance varies in relation to motor current ($I_{motor}$), motor torque (M), motor speed (n), and output power ($P_{out}$), assuming negligible internal friction. The motor current, $I_{motor}$, is a linear function of the motor torque, M. $I_{motor}=f(M)$, or $\Delta I_{motor}=\Delta M$. Increasing current to the motor, $I_{motor}$, increases the motor's torque. Motor speed, n, is an inverse linear function of the motor torque, M. $n=f(M)$, or $\Delta n=-\Delta M$. Motor speed, n, increases as motor torque, M, decreases. Finally, the output power, $P_{out}$, is determined by the applied motor current, $I_{motor}$, multiplied by the motor generator Electro Motive Force, $V_{EMF}$. $P_{out}=I_{motor} \cdot V_{EMF}$, or $P_{out}=I^2_{motor} \cdot R$. It may therefore be seen that the speed, power, and torque of the motor may all be controlled by controlling either the current or voltage delivered to the motor.

DC motors function as both resistors to supply voltage and current and also as generators, creating a voltage described as "back electro magnetic force" or BackEMF. By placing a relatively small resistor, as sensing resistor, in series with the load, and measuring the voltage across this resistor, it is possible to determine the current through the resistor and thereby to the load. The current through the resistor is changed depending on the BackEMP from the motor. The measured signal from across the sensing resistor is directed to a differential amplifier. By comparing the sensed current or voltage from the resistor and the motor, the differential amplifier can create a signal reflecting the operational condition of the motor and convey this signal to circuit control logic.

Typically, the status of a DC motor operating within a set current is sensed by a "transduction amplifier," which is so called because it maps voltages to currents or current to voltages. A typical transduction amplifier for DC motor control is a differential operational amplifier which typically has a voltage input mapping to a current magnitude. The voltage, or current, in a DC motor circuit is read by a differential amplifier as determined from reading voltage from the sensing resistor in series with the load. A voltage proportional to motor current, which is the inductor current, is generated by the sensing resistor and the differential amplifier. The sensing resistor voltage is then compared against a reference voltage. Again, a problem with this type of control is that a differential amplifier operates only within a specific voltage range. It is therefore necessary to keep the system voltages within that range.

A conventional solution to controlling the voltage to the differential amplifier is to increase or decrease the resistance of the circuit in relation to the decrease or increase of the applied current. From Ohm's Law, $v=i \cdot R$, it is well known to change resistor values to keep a constant voltage with changing current. The problem with using a conventional circuit is that current required to control the motor, as applied to the sensing resistor, may exceed the operational voltage range of the differential amplifier. Therefore, the circuit is limited to a small current range for any selected resistor value. A conventional solution to this problem has been to physically switch resistors in and out of the circuit to accommodate changing current. The physical switching of the resistors creates it own problems of error introduced by the added resistance of the switching mechanisms or devices themselves.

For a set motor current, the applied voltage is controlled by Pulse Wide Modulation, PWM, of the source drivers within a pre-set hysteresis format. Load current is monitored through an inline series resistor that is constantly monitored by the differential amplifier. Then the current reaches a set point, as determined by the feedback analysis and motor control logic, stages may be selected in or out of the circuit to permit a change of current, yet maintaining the appropriate sensing voltage range for the differential amplifier.

It is therefore a principal object of this invention to provide a motor driver with a predictable sensing resistance value over a broad range of dynamically changing current magnitudes.

These and other objects will be apparent to those skilled in the art.

BRIEF SUMMARY OF THE INVENTION

A current sampling half-bridge output driver capable of sensing and adjusting to a range of currents; having a plurality of selectable stages of current sensing circuits with a plurality of sensing resistors operatively connected between the stages; wherein the signal across the sensing resistors varies with the feedback signal from the motor and the variation is detected by a differential amplifier which is in communication with a logic device capable of connecting or disconnecting current sensing stages to adjust current to the motor. The series resistors in combination with the selectable stages make it possible to dynamically and predictably adjust the driver to a wide range of currents.

DETAILED DESCRIPTION OF THE PREFERRED EMBODIMENT

Figure 1:
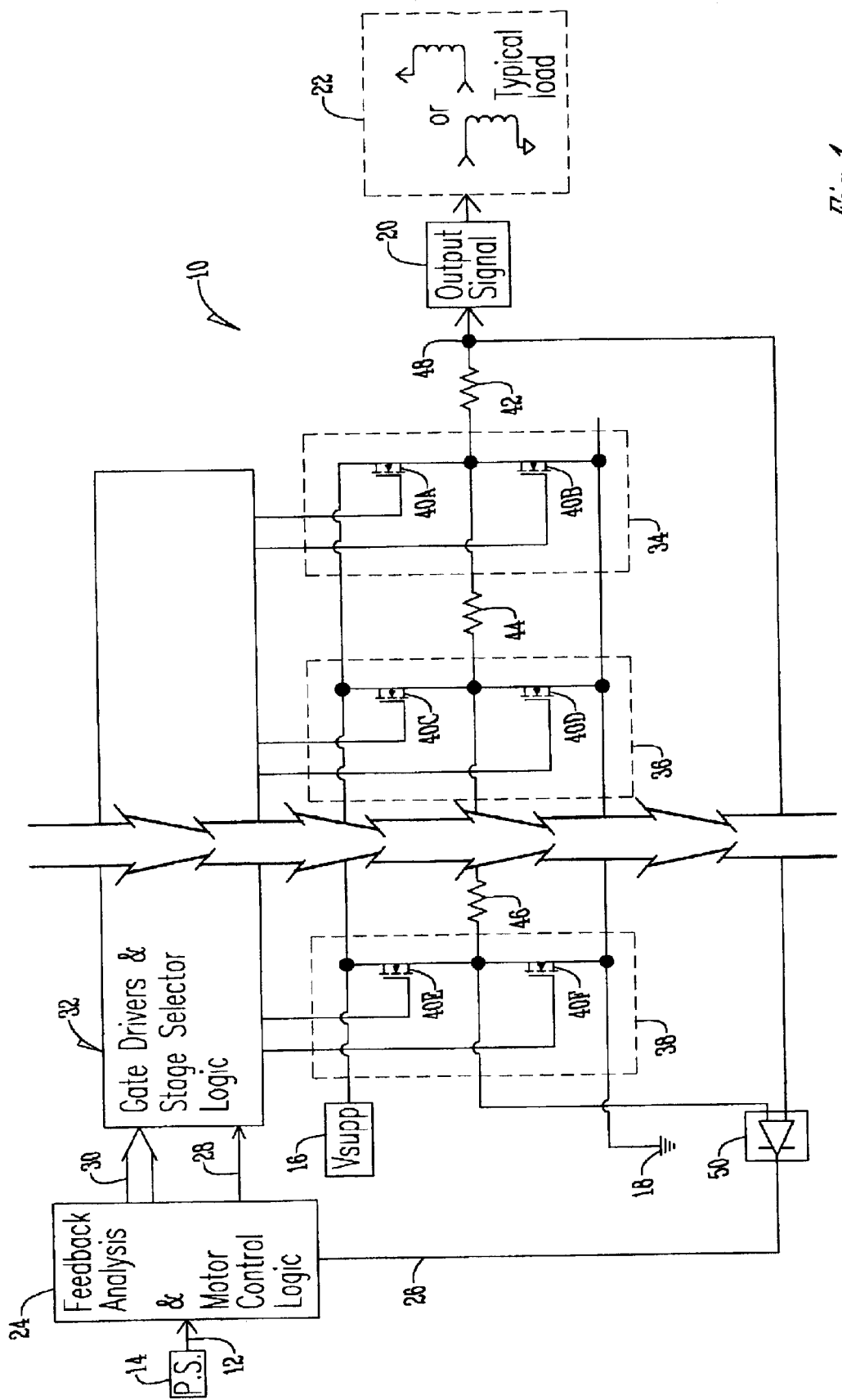
FIG. 1 is a schematic circuit diagram of the preferred embodiment of the invention.

The present invention will be described as it applies to its preferred embodiment. It is not intended that the present invention be limited to the preferred embodiment. It is intended that the invention cover all modifications and alternatives that may be included within the spirit and scope of the invention.

With reference to FIG. 1, the output driver 10 receives input power 12 from power supply 14 and Vsupp 16, and communicates with ground 18 to generate output signal 20. Output driver 10 varies the input power 12 in voltage and current such that the output signal 20 to a load 22 stays within determined operating limitations. In a preferred embodiment, it is anticipated that the load will be a permanent magnet DC motor with a unipolar motor drive. However, it is understood that this invention may be adapted to control other types of DC motors, including brushed and brushless motors and those with three or more phases.

A means for feedback analysis and motor control logic 24 is included within driver 10 and receives power from power supply 12. The means for feedback analysis and motor control logic 24 receives a power signal 12 and a feedback signal 26, and generates PWM signal 28 and current range select signal 30.

The speed of a DC motor, in a closed-loop system, given a set resistor and current, is typically controlled by pulse wide modulation, PWM, of the input voltage. A conventional motor driver in unipolar configuration applies voltage to the motor at one polarity only. The motor may then be switched on and off by an in series switching means. PWM, is the controlled on and off switching of the power. PWM, in effect, varies the applied voltage to the motor resulting in an average voltage between zero volts and the supply voltage level. The applied average voltage, or PWM, thereby affects the speed, torque, and power of the motor. Controlled application of PWM voltage, in reference to sensed circuit voltage from the motor, may be used to regulate the motor for a desired torque or power level.

The speed of a motor can be set by controlling the torque. This is accomplished by monitoring the motor current and regulating it by adjusting the PWM. When necessary, additional current may be added to the system by the current range select 30. The PWM signal 28 and the current range select signal 30 are communicated to a means for gate driver and stage selection logic 32, which is in electrical connection with a plurality of half-bridge stages 34, 36, and 38.

A problem with pulse width modulation control is that PWM is only effective within the operational voltage range of the differential amplifier. The present invention is able to dynamically adjust to changing motor current demands and resistor requirements. If more or less power, torque, or speed is desired from the motor than is possible within that operational current and voltage range, another stage may be added or deleted to the circuit thereby adjusting the resistance and current to the circuit. Proper sizing of the resistor associated with each stage will keep the voltage of the system within the operational range of the differential amplifier.

In order to permit a range of currents, half-bridge stages 34, 36, and 38 are separately and individually electrically selectable into the circuit by the means for gate driver and stage selection logic 32. Half-bridge stages 34, 36, and 38 are of conventional circuitry and may include any suitable electrical switch 40a–40f, including NFET, PFET, BJT, or IGBT. A sensing resistor 42 is electrically connected in series between half-bridge stage 34 and a feedback tap 48 which is in electrical series communication with the load 22. Similarly, a sensing resistor 44 is in electrical series communication with half-bridge stage 34 and sensing resistor 42, and sensing resistor 46 is in electrical series communication with half-bridge stage 36 and sensing resistor 44. A plurality of sensing resistors and associated half-bridge stages may similarly reside between sensing resistor 46 and half-bridge stage 36. Additional stages are also added to the system in order to add the proper amount of resistance to keep the differential amplifier within its operational voltage range.

The invention is preferably designed in a half-bridge configuration. This configuration is desirable in the preferred embodiment because dissipation losses are minimized. It also has the added advantage of active braking of the motor by switching one of the transistors to permanently on to effectively short-circuit the motor $V_{EMF}$. Also, a half-bridge circuit is preferred to control multi-phase motors, particularly brushless DC motors in 3- and 5-phase designs.

The present invention overcomes the problem of errors from switching resistors by placing appropriately sized sensing resistors in series within cascading stages. As current increases or decreases within the circuit, the sensing resistors in each stage are added in series or deleted from the circuit. Since the sensing resistors in each stage are connected in series, there is no switching mechanism associated with them and no additional resistance. Adding a sensor resistor to the circuit simply requires adding the stage. There is no switching of the individual resistors and no additional unwanted resistance is introduced.

A differential amplifier 50 is in electrical communication receiving electrical signals from the feedback tap 48 and half-bridge stage 38 in electrical series with sensing resistor 46. Differential amplifier 50 sends feedback signal 26 to the feedback analysis and motor control logic means.

The present invention controls a motor by sensing the current. Current mode control of a motor is achieved by monitoring the voltage across a set of sensing resistors. The sensed voltage is processed through a differential amplified and that signal is then passed on to a means for driving gates and switching.

In use, the initial stage will have a relatively small sensing resistor, and is associated with a large applied current. As the current lessens such that the voltage approaches the lower range of the differential amplifier, the next stage is added to the circuit, thereby adding an additional sensing resistor in series. The total resistance is the sum of the resistors in the two stages, and the voltage level to the differential amplifier is thereby restored. This process continues through switching logic to add resistors to falling current levels and to delete resistors from rising current levels. By this method, the current to the motor may be increased or decreased to accommodate the load or torque, and the voltage through the differential amplifier will remain constantly within the operating range. The driver may also be configured in pairs to provide full-bridge drive for bi-directional motor control.

Whereas the invention has been shown and described in connection with the preferred embodiments thereof, it will be understood that many modifications, substitutions, and additions may be made which are within the intended broad scope of the following claims.

It is therefore seen that this invention will at least provide a motor driver with a predictable sensing resistance value over a broad range of dynamically changing current magnitudes.

From the foregoing, it can be seen that the present invention accomplishes at least all of the stated objectives.

What is claimed is:

1. A current sampling output driver for multi-range currents, comprising:

a voltage source having first and second terminals;

a transduction amplifier;

a plurality of stages of current sensing circuits with a plurality of current sensing resistors operatively connected between the first and second terminals;

the current sensing resistors operatively connected to the stages of current sensing circuits and the current sensing resistors operatively connected in series between a load and the transduction amplifier;

a means for selectively connecting stages of current sensing circuits; and a feedback signal lead operatively connected between the transduction amplifier and the load.

2. The output driver of claim 1 wherein the current sensing circuit is a half-bridge circuit.

3. The output driver of claim 1 wherein the current sensing circuit is a full-bridge circuit.

4. The output driver of claim 1 wherein the transduction amplifier is a differential operational amplifier.

5. The output driver of claim 1 wherein the voltage source is direct current.

6. A current sampling half-bridge output driver for multi-range currents, comprising:
- a voltage source having first and second terminals;
- a differential circuit;
- a plurality of stages of current sensing circuits with a plurality of current sensing resistors operatively connected between the first and second terminals;
- the current sensing resistors operatively connected to the stages of current sensing circuits and the current sensing resistors operatively connected in series between a load and the differential circuit;
- a means for selectively electrically connecting stages of current sensing circuits; and
- a feedback signal lead operatively connected between the transduction amplifier and the load.

7. A current sampling half-bridge output driver for multi-range currents, comprising:
- a direct current voltage source having first and second terminals;
- a differential amplifier;
- a plurality of stages of current sensing half-bridge circuits with a plurality of current sensing resistors operatively connected between the first and second terminals;
- the current sensing resistors operatively connected to the stages of current sensing half-bridge circuits and the current sensing resistors operatively connected in series between a load and the differential amplifier;
- a means for selectively electrically connecting stages of current sensing circuits;
- a feedback signal lead operatively connected between the transduction amplifier and the load;
- a means for feedback analysis operatively connected to the feedback lead and the means for selectively electrically connecting stages of current sensing half-bridge circuits; and
- a means for logic control of the current and voltage operatively connected to the feedback lead and the means for selectively electrically connecting stages of the current sensing half-bridge circuits.

8. The output driver of claim 7 wherein the means for logic control of the current and voltage is a pulse width modulator.

* * * * *